United States Patent [19]

Nakayama et al.

[11] 4,079,281
[45] Mar. 14, 1978

[54] SHAPE, AT-CUT CRYSTAL OSCILLATOR

[75] Inventors: Toshihiko Nakayama, Tokorozawa; Isao Koyama, Kodaira; Hisao Wakabayashi, Higashikurume; Hiroshi Hishida, Sayama, all of Japan

[73] Assignee: Citizen Watch Co., Ltd., Tokyo, Japan

[21] Appl. No.: 732,063

[22] Filed: Oct. 13, 1976

[30] Foreign Application Priority Data

Oct. 14, 1975 Japan .................. 50-122924

[51] Int. Cl.$^2$ .............. H01L 41/04; H01L 41/18
[52] U.S. Cl. .................... 310/360; 310/369; 310/348
[58] Field of Search ........... 310/9.5, 9.6, 360, 361, 310/362, 369

[56] References Cited

U.S. PATENT DOCUMENTS

| 2,261,791 | 11/1941 | Bokovoy | 310/9.6 |
| 2,575,819 | 11/1951 | Laird | 310/9.6 X |
| 2,626,363 | 1/1953 | Holmbeck | 310/9.6 |
| 2,676,275 | 4/1954 | Bigler | 310/9.6 X |
| 2,677,064 | 4/1954 | Hill | 310/9.6 X |
| 2,698,909 | 1/1955 | Wright et al. | 310/9.6 X |

*Primary Examiner*—Mark O. Budd
*Attorney, Agent, or Firm*—Koda and Androlia

[57] ABSTRACT

An improved AT-cut crystal oscillator for electronic watches. The AT-cut crystal oscillator is of substantially disc-shape. Furthermore, the AT-cut crystal oscillator is shaped in cross-section such that the periphery of the disc-shaped crystal oscillator is abruptly tapered. In the preferred embodiment, the cross-section is trapezoidal.

5 Claims, 26 Drawing Figures

(a)

(b)

(c)

(a)

(b)

(c)

(b)

(c)

(b)

(c)

SHAPE, AT-CUT CRYSTAL OSCILLATOR

BACKGROUND OF THE INVENTION

1. Field of Invention

This invention relates to crystal oscillators and more particularly to AT-cut crystal oscillators for electronic timepieces.

2. Prior Art

In conventional crystal oscillators for watches, a tuning fork-type crystal oscillator as shown in FIG. 1 has been broadly used. This type has, however, inferior physical characteristics. Such characteristics include a frequency-temperature characteristic curve of a inverted parabola having a zero temperature coefficient at approximately room temperature as shown in FIG. 2, a total differential in frequency as much as 20 parts per million, and a frequency aging effect of $5 \times 10^{-6}$ per year. In addition, the fork-shape of the tuning fork oscillator is rather complex to manufacture thereby increasing manufacturing costs. Furthermore, its impact strength and vibration characteristics are not very good because of the complex and weak supporting structure. Accordingly, this type has not been satisfactory as a time standard for either a high quality watch or a low cost watch.

In addition to the tuning fork-type oscillator, shown in FIG. 3 is the configuration of an AT-cut crystal oscillator having a frequency greater than or equal to 4 MHz which is used in electronic communication instruments in general. FIG. 4 shows a distribution of a displacement in vibration mode of AT-cut crystal from the center of the crystal oscillator to its periphery as a result of touching it by means of the "Probe Method". The AT-cut crystal oscillator for electronic communications instruments cannot be used for watches because of the fact that the crystal oscillator itself is too large and the supporting structure is not strong enough to protect against impact damage. In addition, if a conventional AT-cut crystal oscillator of this type is made smaller, it results in a deterioration of the characteristics of the AT-cut crystal oscillator and in particular, the temperature characteristic, the aging effect and the crystal impedance.

SUMMARY OF THE INVENTION

Accordingly, it is a general object of the present invention to provide an AT-cut crystal oscillator which does not have the drawbacks of a turning fork-type AT-cut crystal oscillator or those used in communication instruments.

It is another object of the present invention to provide an AT-cut crystal oscillator which is low in cost.

It is still another object of the present invention to provide an AT-cut crystal oscillator which is high in quality.

It is also an object of the present invention to provide an AT-cut crystal oscillator which can be securely mounted in an electronic timepiece without having any substantial effect on its characteristics.

In keeping with the principles of the present invention, the objects are accomplished by a unique AT-cut crystal oscillator having substantially a disc-shape. Furthermore, the AT-cut crystal oscillator is shaped in cross-sections such that the periphery of the disc-shaped crystal oscillator is abruptly tapered. In particular, in the preferred embodiments, the cross-section of the crystal oscillator is arranged and configured such that along two axes of the crystal oscillator which are 90° apart, one is rectangular in shape and the other is substantially a trapezoidal in shape or two trapezoidal shapes put together with their longer base attached.

BRIEF DESCRIPTION OF THE DRAWINGS

The above mentioned and other features and objects of the present invention will become more apparent by reference to the following description taken in conjunction with the accompanying drawings wherein like referenced numerals denote like elements, and in which:

FIG. 3(b) is a cross-section of the AT-cut crystal oscillator of FIG. 3 along the lines A—A;

FIG. 11(b) is a cross-sectional view of the embodiment of FIG. 11(a) along the line A—A;

FIG. 11(c) is a cross-sectional view of the embodiment of FIG. 11(a) along the line B—B;

FIG. 12(a) is a plan view of a fourth embodiment of an AT-cut crystal oscillator in accordance with the teachings of the present invention;

FIG. 12 (c) is a cross-sectional view of the embodiment of FIG. 12 (a) along the line B—B.

DETAILED DESCRIPTION OF THE INVENTION

Figure 5:
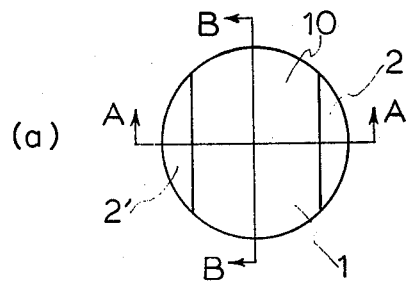
FIG. 5(a) is a plan view of an AT-cut crystal oscillator in accordance with the teachings of the present invention.
FIG. 5(b) is a cross-section of the embodiment of FIG. 5(a) along the line A—A.
FIG. 5(c) is a cross-sectional view of the embodiment of FIG. 5(a) looking along the lines B—B.
Figure 5:
Figure 5:

Referring to FIG. 5 (a) through 5 (c), shown therein are the plan and cross-sectional views of an embodiment of an AT-cut crystal oscillator in accordance with the teachings of the present invention. The AT-cut crystal oscillator 10 is substantially disc-shaped having a flat portion 1 and downwardly sloping portions 2 and 2' at its periphery. As viewed in cross-sectional along the line A—A, the shape of oscillator 10 is a trapezoid as shown in FIG. 5 (b) while the cross-section of the disc-shaped oscillator 10 taken along the line B—B is rectangular shaped as shown in FIG. 5 (c).

Figure 1:
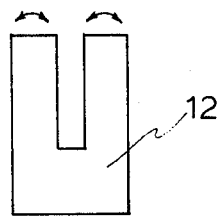
FIG. 1 is a plan view of a tuning fork-shaped crystal oscillator of the prior art.
Figure 2:
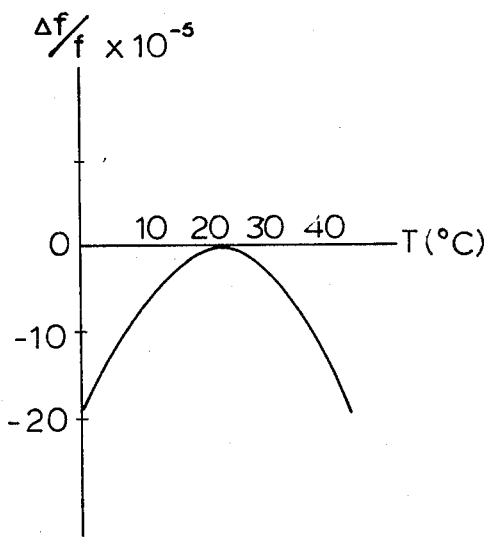
FIG. 2 illustrates the frequency-temperature characteristics of the tuning fork-shaped oscillator of FIG. 1.
Figure 3:
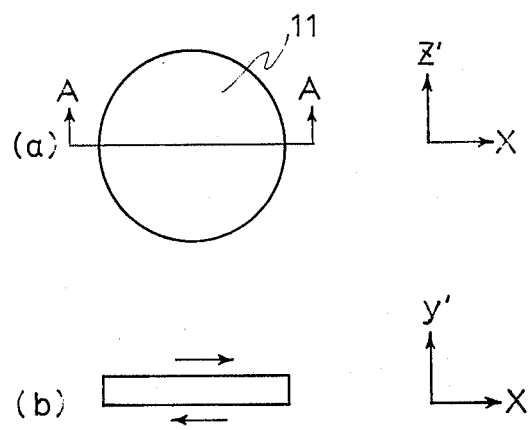
FIG. 3 (a) is a plan view of an AT-cut crystal oscillator of the prior art.
Figure 4:
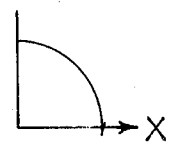
FIG. 4 illustrates the frequency differential of the AT-cut crystal oscillator of FIG. 3.
Figure 6:
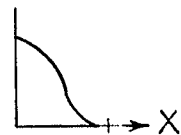
FIG. 6 illustrates the frequency differential curve of the embodiment of FIG. 5(a)

In FIG. 6 is shown the curve of the change in frequency of the oscillator of FIG. 5(a) from the center to the periphery thereof as a result of touching the crystal oscillator 10 by means of the "Probe Method". FIG. 6 clearly shows that the displacement of vibration mode of AT-cut crystal has been reduced by forming the slopes 2 and 2' as compared to the conventional type of crystal oscillators shown in FIG. 4. Accordingly, it is possible to avoid the adverse effect due to the supporting which was suffered by the conventional type crystal oscillator if the oscillator 10 is provided with slopes 2 and 2' and supported at its slopes 2 and 2'.

Figure 7:
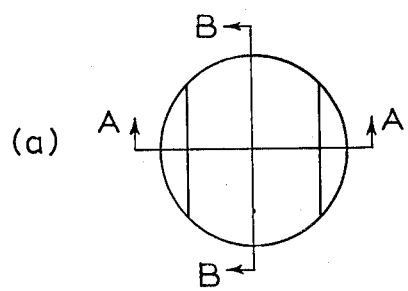
FIG. 7(a) is a plan view of a second embodiment of an AT-cut crystal oscillator in accordance with the teachings of the present invention.
FIG. 7(b) is a cross-section of the embodient of FIG. 7(a) along the lines A—A.
FIG. 7(c) is a cross-section of the embodiment of FIG. 7(a) looking along the line B—B.
Figure 7:
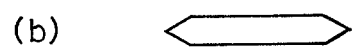
Figure 7:

Referring to FIGS. 7(a), (b) and (c), shown therein is a second embodiment of an AT-cut crystal oscillator in accordance with the teachings of the present invention. The second embodiment is shaped such that the cross-section taken along the line A—A is substantially equal to two trapezoids with the longer of the two bases placed together as shown in FIG. 7(b). Similar to the first embodiment, the second embodiment is of substantially rectangular cross-section along the line B—B as shown in FIG. 7(c).

Figure 8:
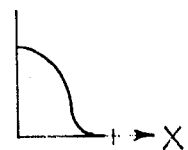
FIG. 8 illustrates the frequency differential curve of the AT-cut crystal oscillator of FIG. 7(a)

In FIG. 8 is shown the frequency differential of the second embodiment of the AT-cut crystal oscillator. FIG. 8 clearly shows that the differential decreases drastically as one gets closer to the periphery of the AT-cut crystal oscillator.

Figure 9:
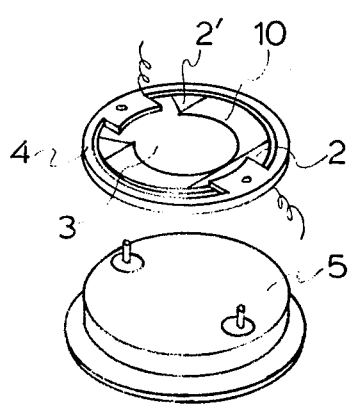
FIG. 9 illustrates a supporting structure utilized with the AT-cut crystal oscillator of the present invention.

In FIG. 9 is shown a plan view of a mounting structure for an AT-cut crystal oscillator in accordance with the teachings of the present invention. The AT-cut crystal oscillator 10 has a diameter of 6mm or less and slopes 2 and 2'. An electrode 3 is provided on both sides of the AT-cut crystal oscillator 10 and AT-cut crystal oscillator 10 is coupled to a seal end 5 by an elastic ring 4.

Figure 10:
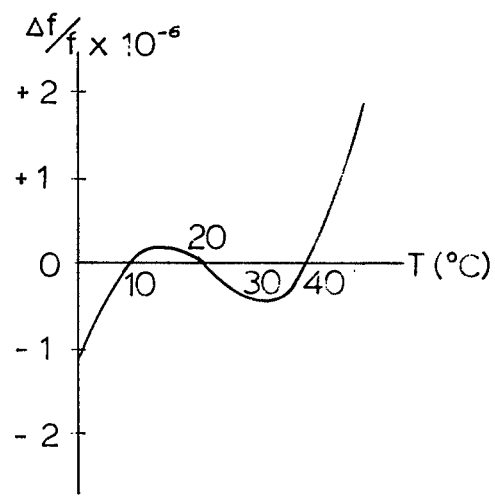
FIG. 10 illustrates the frequency-temperature characteristics of the AT-cut crystal oscillator in accordance with the teachings of the present invention.

Referring to FIG. 10, shown therein is a curve of the frequency temperature characteristics of an AT-cut crystal oscillator 10 in accordance with the teachings of the present invention which illustrate the improved quality of this invention over the tuning fork-type crystal oscillator. In particular, there are two points where the temperature coefficient is zero. Furthermore, the frequency differential is less than three parts per million. In addition, experiments have shown that AT-cut crystal oscillators in accordance with the teachings of the present invention have other advantages in connection with the crystal impedance and aging effects.

Figure 11:
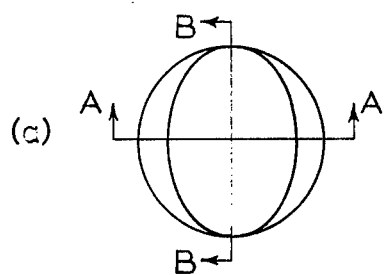
FIG. 11 (a) is a plan view of a third embodiment of an AT-cut crystal oscillator in accordance with the teachings of the present invention.
Figure 11:
Figure 11:

Referring to FIG. 11, shown therein is a third embodiment of a crystal oscillator in accordance with the teachings of the present invention. In FIG. 11, the slopes 2 and 2' are formed in the shaped of a cresent as shown in FIG. 11(a). Otherwise, the embodiment of FIG. 11(a), (b) and (c) is substantially the same as that shown in FIGS. 5(a), (b) and (c).

Figure 12:
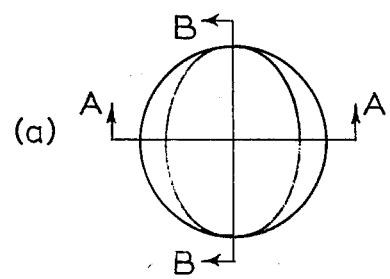
FIG. 12 (b) is a cross-sectional view of the embodiment of FIG. 12 (a) along the line A—A.
Figure 12:
Figure 12:

Referring to FIG. 12, shown therein is a fourth embodiment of an AT-cut crystal oscillator in accordance with the teachings of the present invention. The embodiment of FIG. 12 is substantially the same as that shown in FIG. 7 except that the sloping regions on both sides of the AT-cut crystal oscillator are crescent shaped. Otherwise, the embodiment shown in FIGS. 12(a), (b) and (c) is substantially the same as the embodiment shown in FIGS. 7(a), (b) and (c).

Figure 13:
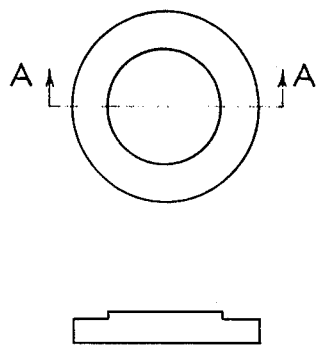
FIG. 13 through 17 are additional embodiments of an AT-cut crystal oscillator in accordance with the teachings of the invention shown in plan view and cross-section along the line A—A.
Figure 14:
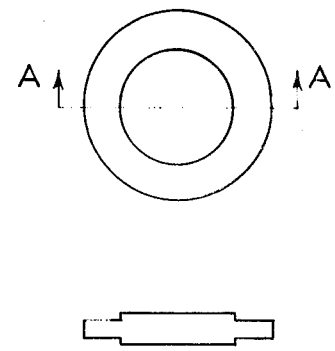

Referring to FIGS. 13 through 17, shown therein are other embodiments of an AT-cut crystal oscillator in accordance with the teachings of the present invention shown in a plan view and a cross-sectional view taken along the lines A—A. As shown in FIG. 13, this fifth embodiment comprises a circumferential step cut out in the periphery of the AT-cut crystal oscillator. As shown in FIG. 14, this sixth embodiment comprises a circumferential step cut out of the periphery of both sides of the AT-cut crystal oscillator.

Figure 15:
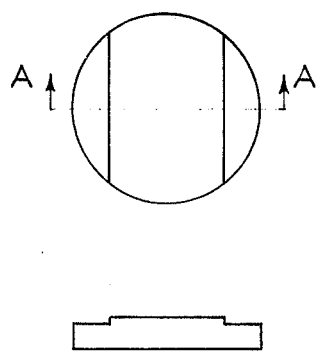
Figure 16:
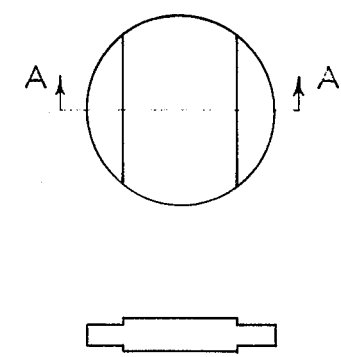
Figure 17:
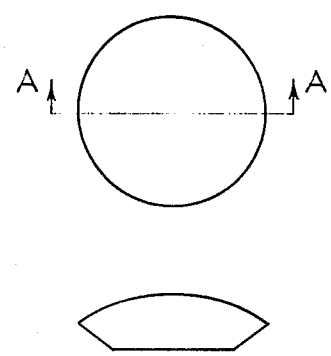

As shown in FIG. 15, the seventh embodiment comprises a disc-shaped AT-cut crystal oscillator having two straight step portions cut out of two opposite edges of the periphery of the disc-shaped AT-cut crystal oscillator. As shown in FIG. 16, the eighth embodiment comprises pairs of straight step-like portions cut out of opposing edges of the periphery of the AT-cut crystal oscillator. As shown in FIG. 17, the ninth embodiment comprises in general, a trapezoidal shape wherein the long base is curved.

As stated above, when using an AT-cut crystal oscillator in accordance with the teachings of the present invention, it is possible to avoid adverse effects upon the AT-cut crystal oscillator due to the supporting structure, to reduce the manufacturing costs because of a simple configuration as compared to the conventional tuning fork-type crystal oscillators and to improve the preciseness of the frequency by having better frequency characteristics over the prior art crystal oscillators.

In all cases it is understood that the above described embodiments are merely illustrative of but a few of the possible specific embodiments which represent the applications of the principles of the present invention. Numerous and varied other arrangements can be readily devised by those skilled in the art without departing from the spirit and scope of the invention.

I claim:

1. An improved AT-cut crystal oscillator for electronic timepieces comprising a disc shaped AT-cut crystal oscillator wherein the cross section of said crystal oscillator along one of two axes thereof oriented 90 degrees apart one from the other is substantially a rectangular shape and the other cross section along the other axis is substantially a trapezoidal shape wherein the long base of the trapezoidal shape is curved.

2. An improved AT-cut crystal oscillator for electronic timepieces comprising a disc-shaped AT-cut crystal oscillator wherein the cross-section of said oscillator along one of two axes thereof oriented 90° apart one from the other is substantially a rectangular shape and the cross-section along the other axis is substantially a trapezoidal shape.

3. An AT-cut crystal oscillator according to claim 2 wherein said crystal oscillator has a frequency of greater than 4MHz and a diameter of less than 6mm.

4. An AT-cut crystal oscillator for electronic timepieces comprising a disc-shaped crystal oscillator wherein the cross-section of said oscillator along one of two axes oriented 90° apart one from the other is substantially a rectangular shape and the cross-section along the other axis is substantially in the shape of two trapezoids put together with their longer bases attached to each other.

5. An AT-cut crystal oscillator according to claim 4 wherein said oscillator has a frequency greater than 4MHz and a diameter of less than 6mm.

* * * * *